United States Patent
Mahant-Shetti et al.

[11] Patent Number: 5,422,581
[45] Date of Patent: Jun. 6, 1995

[54] GATE ARRAY CELL WITH PREDEFINED CONNECTION PATTERNS

[75] Inventors: Shivaling S. Mahant-Shetti, Richardson; Robert J. Landers, Plano, both of Tex.

[73] Assignee: Texas Instruments Incorporated, Dallas, Tex.

[21] Appl. No.: 291,639

[22] Filed: Aug. 17, 1994

[51] Int. Cl.⁶ .................................. H03K 19/173
[52] U.S. Cl. ................................ 326/50; 326/41; 326/45; 257/206
[58] Field of Search ............... 326/47, 50, 45, 41; 257/204, 206

[56] References Cited

U.S. PATENT DOCUMENTS

| | | | |
|---|---|---|---|
| 4,453,096 | 6/1984 | Le Can | 307/468 |
| 4,745,305 | 5/1988 | Crafts | 307/469 |
| 4,771,327 | 9/1988 | Usui | 257/206 |
| 4,785,199 | 11/1988 | Kolodny | 307/469 |
| 5,055,716 | 10/1991 | El Gamel | 257/206 |
| 5,270,587 | 12/1993 | Zagar | 307/469 |
| 5,289,021 | 2/1994 | El Gamel | 257/206 |

*Primary Examiner*—Edward P. Westin
*Assistant Examiner*—Andrew Sanders
*Attorney, Agent, or Firm*—John D. Crane; Wade J. Brady, III; Richard L. Donaldson

[57] ABSTRACT

A base cell for a CMOS gate array is provided with a first plurality of N-channel transistors 12, 14, 16 with two such N-channel transistors coupled in series. A first plurality of P-channel transistors 50, 52, 54 with two such P-channel transistors coupled in series. These transistors are interconnected at the transistor level to form a partially prewired circuit. Additional pairs of series connected N-channel transistors (18, 20), (22, 24) and pairs of series connected P-channel transistors (56, 58), (60, 62) are also provided and are interconnected at the transistor level to form additional partially prewired circuits. By adding additional levels of wiring 100, 102, the base cell can be finally wired to form a plurality of different logic circuits.

12 Claims, 3 Drawing Sheets

GATE ARRAY CELL WITH PREDEFINED CONNECTION PATTERNS

FIELD OF THE INVENTION

This invention relates broadly to the field of gate arrays and particularly to a gate array having an architecture based on utilizing a cell having a plurality of partially prewired circuits as the principal building block for creating both simple and complex logic functions including the multiplexer function. The cell includes a separate plurality of transistors for performing other logic functions.

BACKGROUND OF THE INVENTION

Traditional gate array base cells have evolved around efficient layout of transistor arrays. This has been due in part to the number of gates that can be formed in the array and in part due to the number of input/output pins the array has. As circuits have become smaller allowing more gates to be put on a single chip, it has been important to stress development of functions using programmable metal layers. This approach has been used in developing memory circuits, digital signal processing circuits, logic functions such as adders and the like and is based on having transistors available to form NAND gates, AOI cells, inverters, memory cells and the like.

The programmable metal used to produce the desired functions takes up a good deal of available space and has caused, especially in chips with very high integration, a reduction in the density of functions that can be formed As a result, the typical wiring inefficiency for a given array has resulted in as many as 40% of the base cells on the chip not being utilized in the final circuit configuration. The inability to wire up desired functions in a single gate array, however, has increased the cost of utilizing this technology by increasing area required to perform a given function, thus wasting the components which could not be wired.

Another factor which has contributed to reduced efficiency in wiring gate array cells is the fact that the cells themselves have been frequently based on having the transistors available to form 2 input NAND circuits which has heretofore been thought to be quite flexible. However, an investigation of sequential logic functions and data signal processing functions has demonstrated that there is a high frequency of multiplexer circuits in such logic and that the multiplexer has proved to be somewhat difficult to implement in the numbers desired by designers because wiring routing channels are quickly used up.

SUMMARY OF THE INVENTION

The present invention is a CMOS array base cell which is designed to overcome the above mentioned and other problems with prior art base cells and utilizes a plurality of N-type and P-type transistors. At least two of the P-type transistors have their gates electrically connected to the gates of at least two N-type transistors. In addition, at least one other N-type transistor has its gate electrically connected to the gate of at least one P-type transistor. These interconnected transistors form the basic building blocks for the logic functions that can be implemented using the array cell.

The base cell of this invention includes multiple pairs of series connected P-type and N-type transistors having their gates electrically connected together. The series connected N-type transistors which are coupled at their gates to the P-type transistors are also coupled in series with other N-type transistors which are gated from other networks. The total number of transistors and their interconnections makes the present base cell very useful in producing numerous functions ranging from master/slave flip-flops to dual input RAM structures.

In addition to the mentioned interconnected transistors, a least one driver transistors is disposed inside the cell.

DESCRIPTION OF THE DRAWINGS

The above mentioned advantages and features of the present invention are described below in greater detail in connection with the drawings which form a part of the disclosure wherein.

DETAILED DESCRIPTION

Figure 1:
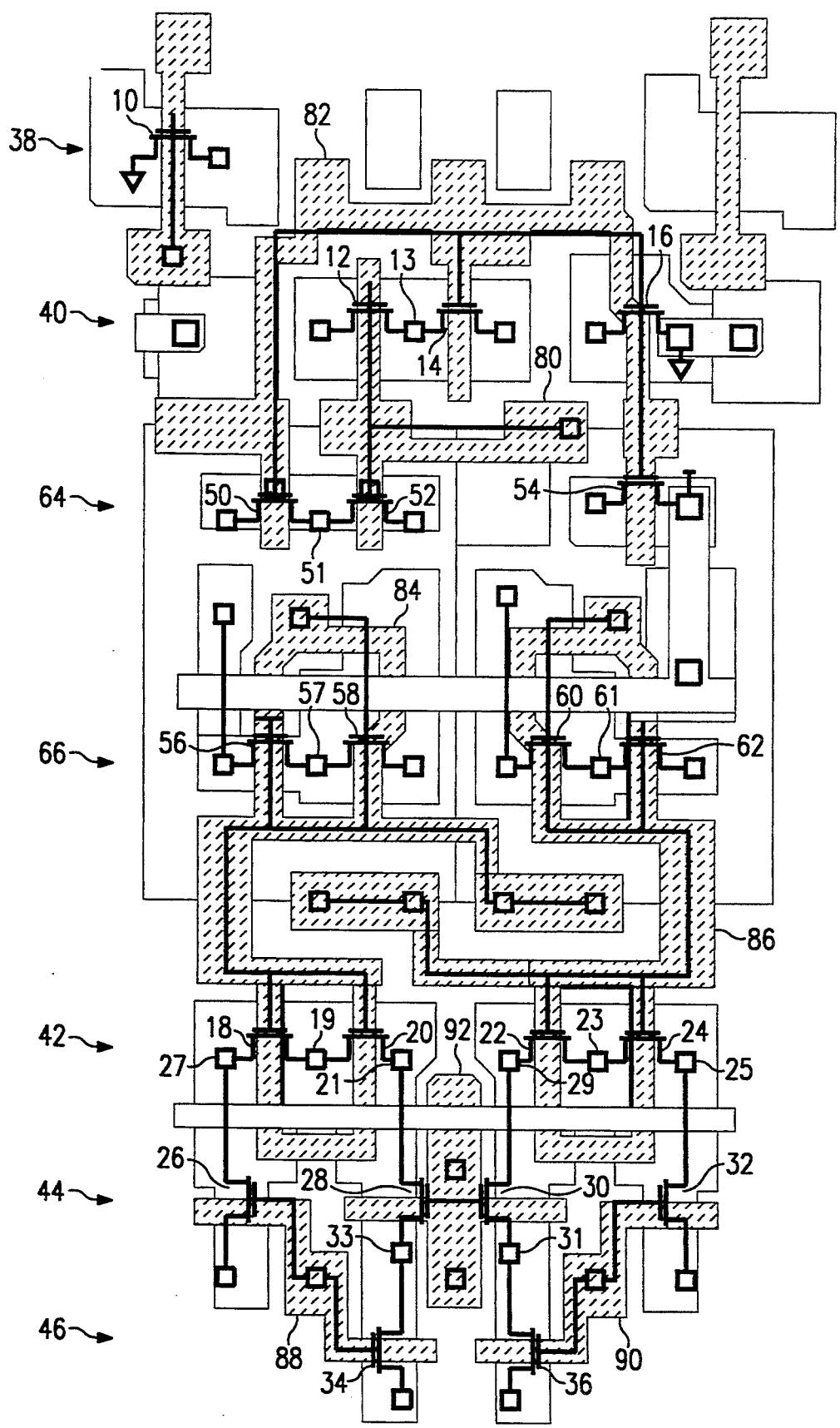
FIG. 1 illustrates a schematic diagram of the base cell of the present invention.

Referring first to FIG. 1, a circuit diagram of the base cell of the present invention is illustrated in a manner which overlies a the structure of the base cell itself. The circuit of FIG. 1 includes a plurality of N-channel transistors 10, 12, 14, 16, 18, 20, 22, 24, 26, 28, 30, 32, 34 and 36 physically located in a plurality of rows indicated generally by arrows 38, 40, 42, 44 and 46. The circuit of FIG. 1 also includes a plurality of P-channel transistors 50, 52, 54, 56, 58, 60 and 62 which are located in different rows indicated generally at 64 and 66.

Transistor 10 is an N-channel transistor which is not interconnected with any other transistor in the cell. N-channel transistors 12 and 14, on the other hand, are series connected together at the silicon level. That is, the source/drain of transistor 12 is formed in contact with the source/drain of the transistor 14 as indicated at 13. A careful viewing of FIG. 1 shows a plurality of other such silicon level series connections at 51, 57, 61, 19, 21, 33, 27, 31, 29, 23, and 25. The gate of transistor 12 is connected at the polysilicon level to the gate of P-channel transistor 52 as indicated by the shaded area 80. All areas in FIG. 1 with the shading the same as area 80 corresponds to wiring in polysilicon at what is referred to herein as the polysilicon level. The gate of transistor 14 is connected by polysilicon 82 to the gate on N-channel transistor 16 and also to the gates of P-channel transistors 50 and 54. Transistors 50 and 52 are also connected together in series at the silicon level at 51. The configuration of transistors 12, 14, 16, 50, 52, and 54 are discussed in greater detail in copending U.S. patent application Ser. No. 08/178,712 filed on Jan. 10, 1994, the content of which is herein incorporated by reference.

A pair of P-channel transistors 56 and 58 are coupled together in series at 57. The gates of these transistors are coupled together by polysilicon lead 84. A second pair of P-channel transistors 60 and 62 are coupled together in series at 61. The gates of these transistors are also coupled together by polysilicon lead 86.

A group of transistors consisting of N-channel transistors 26, 18, 20, 28 and 34 are coupled together in series. The gates of transistors 18 and 20 are coupled together by polysilicon 84 and also coupled to the gates of transistors 56 and 58. A second group of transistors consisting of N-channel transistors 32, 24, 22, 30 and 36 are coupled together in series. The gates of transistors 22 and 24 are coupled together by polysilicon 86 and also coupled to the gates of transistors 60 and 62. In addition, the gates of transistors 26 and 34 are coupled together by polysilicon lead 88 and the gates of transistors 32 and 36 are coupled together by polysilicon lead 90. The gates of transistors 28 and 30 are also coupled together by polysilicon lead 92.

Figure 2:
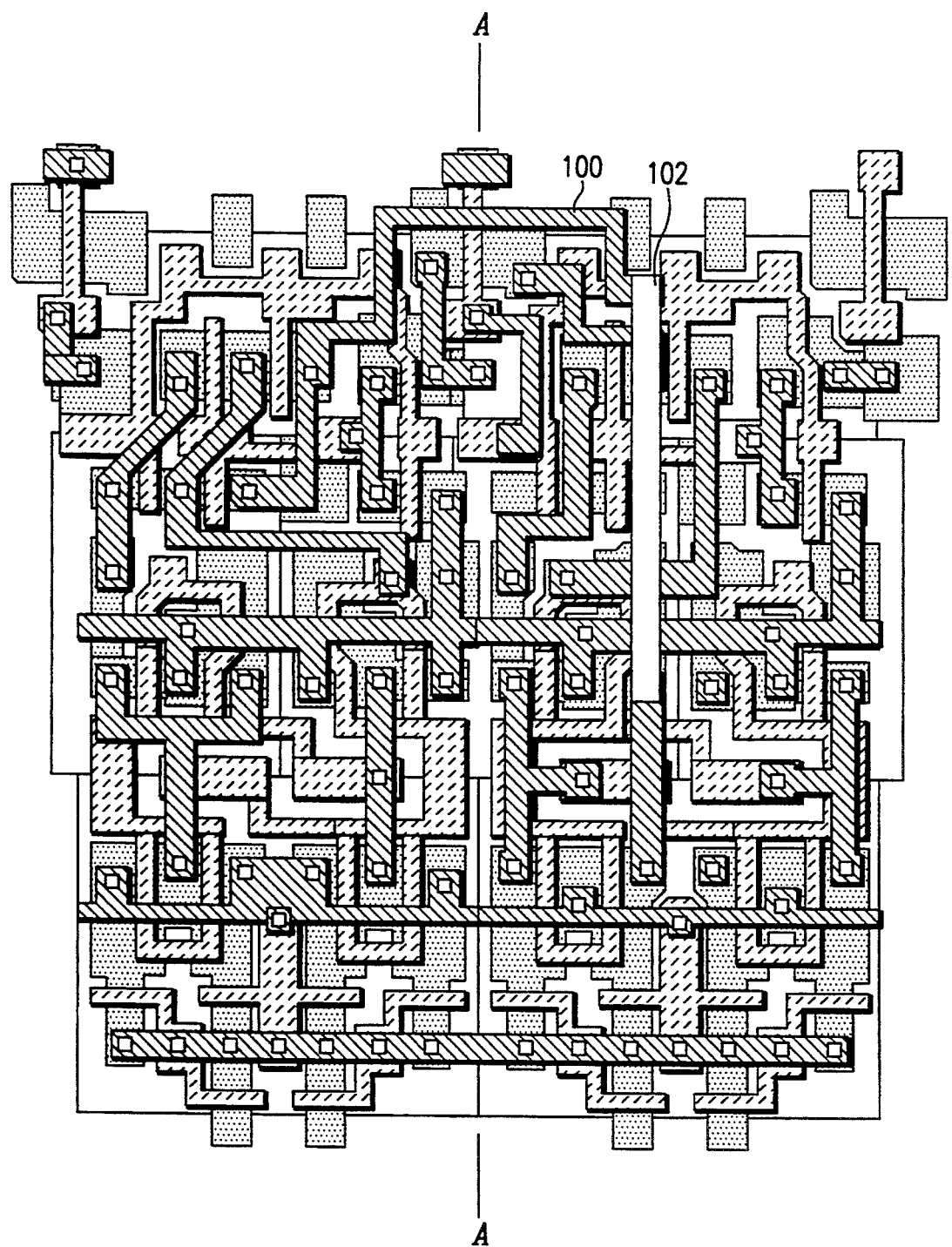
FIG. 2 illustrates how two base cells can be connected together with first and second level wiring to form a master/slave flip-flop.
Figure 3:
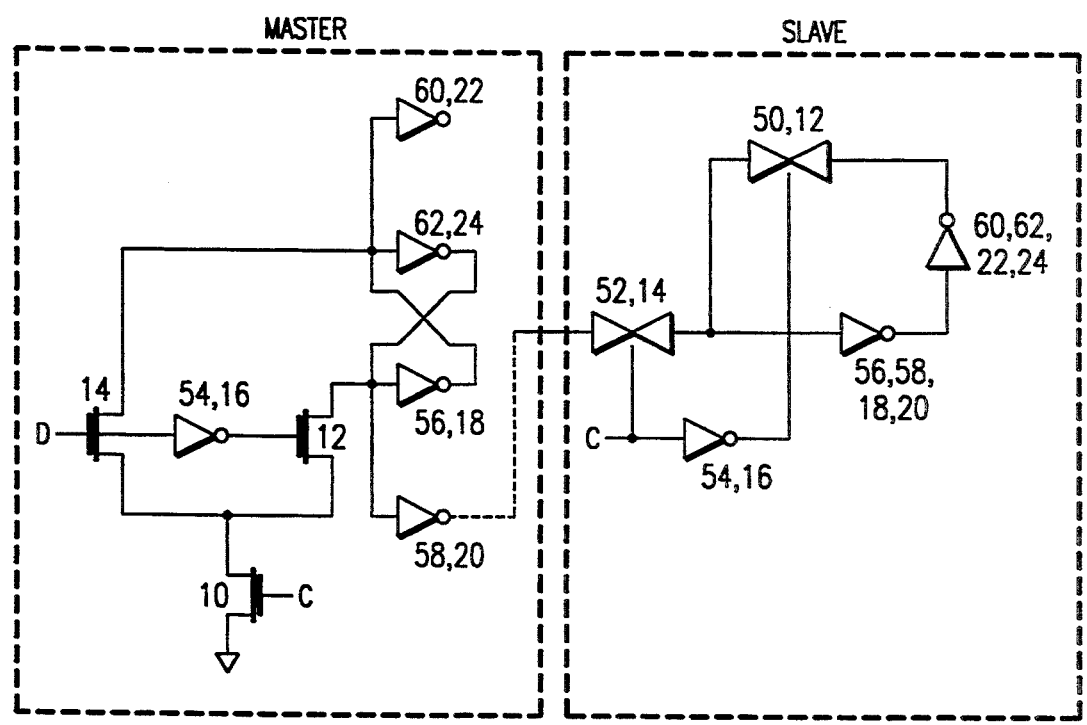
FIG. 3 illustrates the circuit diagram for the master/slave flip-flop of FIG. 2.

Referring now to FIG. 2, two base cells are shown side-by-side with one base cell being disposed to the left of the line A—A and a second base cell disposed to the right of that line. These two base cells are wired using first level wiring having shading of wire 100 and by second level wiring (only one needed) which is illustrated at 102 without any shading at all. The circuit configuration illustrated in FIG. 2 has the functional characteristics of the functional diagram of FIG. 3 which comprises a master/slave flip-flop. The "master" side of the flip-flop of FIG. 3 comprises the circuits illustrated in FIG. 2 disposed to the right of the line A—A. On the other hand, the "slave" side of the flip-flop of FIG. 3 is disposed to the left of line A—A of FIG. 3. The physical elements of FIG. 1 which comprise the various functional elements of FIG. 3 are illustrated therein. The numbers appearing adjacent the functional blocks of FIG. 3 correspond to the transistors identified in the circuit of FIG. 1. Since two cells are interconnected in FIG. 2 to form the circuit of FIG. 3, some of the same identification numbers are utilized in both the master and the slave portions of the flip-flop of FIG. 3.

Returning again to FIG. 1, it is important to keep in mind that some of the wiring of the circuit is achieved actually in the silicon structure of the devices and how they are formed. For example, the series connection between transistors 12 and 14 is formed in silicon. On the other hand, some connections are formed in polysilicon such as, for example, the connection between the gate of transistor 12 and the gate of transistor 52 as illustrated at 104 by the shaded polysilicon connection. Other areas in FIG. 1 shaded the same way as area 104 are also polysilicon interconnections between various points in the base cell illustrated.

The forgoing discussion has discussed how the base cell of the present cell can be configured to form a master/slave flip-flop. It should be noted that the base cell can also be configured in a large number of other wiring patterns with additional base cells to produce different logical functions. Indeed, it can be shown that the configuration of FIG. 1 can produce the AND, OR, EXCLUSIVE OR and INVERT functions which are the only functions that are required in order to produce other logic functions. A multiplexer function is also easily produced. In addition, as noted earlier, it is also possible to easily produce a dual input RAM configuration with the base cells of the type described herein. Those of skill in the art will recognize that these above mentioned functions can be combined to produce any other desired function and, accordingly, the base cell of FIG. 1 is capable of being combined with other base cells wired in different ways to produce virtually any function desired by a system designer.

While the foregoing description has been made with particular emphasis on the embodiment of the invention as illustrated in the drawings, those of skill in the art will readily recognize that the invention may be modified in many ways without departing from the spirit and scope of the present invention.

What is claimed is:

1. A CMOS cell including a plurality of partially wired transistors for use in a gate array comprising, in combination:
   a first plurality of N-channel transistors consisting of two series connected N-channel transistors and another N-channel transistor;
   a first plurality of P-channel transistors consisting of two series connected P-channel transistors and another P-channel transistor;
   first connection means for connecting the gate of one said series connected N-channel transistor and the gate of said another N-channel transistor to the gate of one said series P-channel transistor and the gate of said another P-channel transistor;
   second connection means for connecting the gate of one said series connected N-channel transistor to the gate of one said series connected P-channel transistor;
   a first pair of series connected N-channel transistors;
   a first pair of series connected P-channel transistors; and
   third connection means for connecting the gates of said first pair of series connected N-channel transistors to the gates of said first pair of series connected P-channel transistors.

2. The CMOS cell of claim 1 additionally including a second pair of series connected N-channel transistors connected in series with said first pair of series connected N-channel transistors and a further N-channel transistor coupled in series with said first pair of series connected N-channel transistors, the gate of said further N-channel transistor being connected to the gate of one of said second pair of series connected N-channel transistors.

3. The CMOS cell of claim 1 additionally including:
   a second pair of series connected N-channel transistors;
   a second pair of series connected P-channel transistors; and
   fourth connection means for connecting the gates of said second pair of series connected N-channel transistors to the gates of said second pair of series connected P-channel transistors.

4. The CMOS cell of claim 2 additionally including:
   a second pair of series connected N-channel transistors;
   a second pair of series connected P-channel transistors; and
   fourth connection means for connecting the gates of said second pair of series connected N-channel transistors to the gates of said second pair of series connected P-channel transistors.

5. The CMOS cell of claim 4 additionally including a third pair of series connected N-channel transistors connected in series with said second pair of series connected N-channel transistors and a second further N-channel transistor coupled in series with said third pair of series connected N-channel transistors, the gate of said second further N-channel transistor being connected to the gate of one of said third pair of series connected N-channel transistors.

6. The CMOS cell of claim 5 additionally including a second CMOS cell of claim 5 disposed adjacent thereto additionally including interconnection leads coupled thereto to form a master/slave flip-flop.

7. A CMOS cell including a plurality of partially wired transistors for use in a gate array comprising, in combination:
- a first plurality of N-channel transistors consisting of two series connected N-channel transistors and another N-channel transistor, said two series connected N-channel transistors being series connected at the silicon level;
- a first plurality of P-channel transistors consisting of two series connected P-channel transistors and another P-channel transistor, said two series connected P-channel transistors being series connected at the silicon level;
- first polysilicon connector for connecting the gate of one said series connected N-channel transistor and the gate of said another N-channel transistor to the gate of one said series P-channel transistor and the gate of said another P-channel transistor;
- second polysilicon connector for connecting the gate of one said series connected N-channel transistor to the gate of one said series connected P-channel transistor;
- a first pair of series connected N-channel transistors connected in series at the silicon level;
- a first pair of series connected P-channel transistors connected in series at the silicon level; and
- third polysilicon connector for connecting the gates of said first pair of series connected N-channel transistors to the gates of said first pair of series connected P-channel transistors.

8. The CMOS cell of claim 7 additionally including a second pair of series connected N-channel transistors connected in series at the silicon level with said first pair of series connected N-channel transistors and a further N-channel transistor coupled in series at the silicon level with said first pair of series connected N-channel transistors, the gate of said further N-channel transistor being connected at the polysilicon level to the gate of one of said second pair of series connected N-channel transistors.

9. The CMOS cell of claim 7 additionally including:
- a second pair of series connected N-channel transistors connected in series at the silicon level;
- a second pair of series connected P-channel transistors connected in series at the silicon level; and
- fourth polysilicon connector for connecting the gates of said second pair of series connected N-channel transistors to the gates of said second pair of series connected P-channel transistors.

10. The CMOS cell of claim 8 additionally including:
- a second pair of series connected N-channel transistors connected in series at the silicon level;
- a second pair of series connected P-channel transistors connected in series at the silicon level; and
- fourth polysilicon connector for connecting the gates of said second pair of series connected N-channel transistors to the gates of said second pair of series connected P-channel transistors.

11. The CMOS cell of claim 10 additionally including a third pair of series connected N-channel transistors connected in series at the silicon level with said second pair of series connected N-channel transistors connected in series at the silicon level and a second further N-channel transistor coupled in series at the silicon level with said third pair of series connected N-channel transistors, the gate of said second further N-channel transistor being connected at the polysilicon level to the gate of one of said third pair of series connected N-channel transistors.

12. The CMOS cell of claim 11 additionally including a second CMOS cell of claim 11 disposed adjacent thereto additionally including interconnection leads at the metalization level coupled thereto to form a master/slave flip-flop.

* * * * *